United States Patent [19]

Mauthe

[11] 4,224,635

[45] Sep. 23, 1980

[54] DYNAMIC STORAGE ELEMENT HAVING STATIC STORAGE ELEMENT BEHAVIOR

[75] Inventor: Manfred Mauthe, Munich, Fed. Rep. of Germany

[73] Assignee: Siemens Aktiengesellschaft, Berlin & Munich, Fed. Rep. of Germany

[21] Appl. No.: 922,747

[22] Filed: Jul. 7, 1978

[30] Foreign Application Priority Data

Jul. 29, 1977 [DE] Fed. Rep. of Germany ....... 2734354

[51] Int. Cl.² .................. H01L 27/02; H01L 29/78; H01L 29/34; H03K 5/00
[52] U.S. Cl. ........................................ 357/41; 357/23; 357/24; 357/54; 357/91; 307/238; 365/149
[58] Field of Search ...................... 357/23, 24, 41, 54; 307/221 D, 238; 365/149, 182

[56] References Cited

PUBLICATIONS

Tasch et al., "The Charge-Coupled Ram Cell Concept" IEEE J. Solid-State Circuits, vol. SC-11 (2/76) pp. 58-63.
Spampinato et al., "Single Electrode One-Device Cell" IBM Technical Disclosure Bulletin vol. 15, (11/72) pp. 2019-2020.

Primary Examiner—Gene M. Munson
Attorney, Agent, or Firm—Hill, Van Santen, Steadman, Chiara & Simpson

[57] ABSTRACT

A storage element comprises a storage capacitor which has a storage electrode, arranged insulated over a doped semiconductor layer, connected to a constant voltage, and a selection element which manifest a gate connected to a word line, arranged in an insulated manner above the semiconductor layer. A source zone connected to a bit line is oppositely doped and arranged at the surface of the semiconductor layer. The selection element selectively connects the source zone to a surface storage region of the semiconductor layer which is disposed beneath the storage electrode. Between the storage electrode and the semiconductor layer an insulated electrode is provided and the semiconductor layer is additionally p-doped and n-doped in a zone beneath a portion, adjacent the selection element, of the electrode and an overflow electrode and an oppositely doped drain zone are provided on the side of the electrode opposite the selection element.

6 Claims, 4 Drawing Figures

DYNAMIC STORAGE ELEMENT HAVING STATIC STORAGE ELEMENT BEHAVIOR

BACKGROUND OF THE INVENTION

1. Field of the Invention

The present invention relates to a storage element which consists of a storage capacitor comprising a storage electrode arranged in an insulated fashion over a doped semiconductor layer and connected to a constant voltage, and a selection element which manifest a gate which is connected to a word line and which is arranged in an insulated fashion above the semiconductor layer, and a source zone connected to a bit line, the source zone being oppositely doped and arranged at the surface of the semiconductor layer, wherein the selection element selectively connects the source zone to a surface storage region of the semiconductor layer which is disposed beneath the storage electrode.

2. Description of the Prior Art

Storage elements of the type mentioned above are known, for example, from the "IEEE Journal of Solid-State Circuits", Vol. SC-11, No. 1, February 1976, pp. 58-63, particularly in connection with FIG. 7 thereof. Their method of operation is based on the principle of charge storage with the aid of an inversion layer formed in the storage region at the surface of the semiconductor layer. Two different logic states are thereby characterized by the presence or absence of such an inversion layer.

The selection element, in accordance with this structure, is constructed either in the form of a selection transistor which manifest a drain zone connected to the storage region, arranged in the semiconductor layer on the surface, and being oppositely doped, or the element is constructed in the form of a charge-coupled element which, proceeding from the cited selection transistor, results in the drain zone being omitted, and the storage electrode of the storage capacitor, and hence also the storage region, are displaced to the edge of the gate of the selection element. In the latter case, for example, due to the economic omission of the drain zone, the storage element requires correspondingly less storage area with the same storage capacity.

However, the selection element always serves the purpose of selectively conductively connecting the source zone with the storage region disposed in the semiconductor surface, in dependence upon a control signal which is supplied to the gate of the selection element by way of the word line, in order, during the write-in and read-out of digital information, to render possible charge transfers between the bit line and the storage region.

In storing the "1" logic state, which is characterized by the lack of an inversion layer, there is, however, no thermal equilibrium. In the space charge region which is formed beneath the storage electrode—subjected to a constant voltage—in the storage region of the semiconductor layer, minority carries are constantly thermally generated and migrate to the semiconductor surface and gradually build up an inversion layer at the surface which finally simulates the other logic state. Therefore, a logic "1" written into the storage element, is transferred by the thermal charge carrier generation, which is also designated as dark current influence, into a logic "0". In order to prevent this from happening, the written-in information, after a so-called storage period, must be read, regenerated and read-in again, whereby the storage time is dimensioned so short that the particular written-in logic state is still clearly recognized during the reading operation.

SUMMARY OF THE INVENTION

The object of the present invention is to provide a storage element of the type generally mentioned above which, because of the storage information which must be continuously renewed, is also designated as a dynamic element, such that the written information remains stored for an arbitrary length of time without being regenerated, so that the function of a static storage element is achieved.

According to the invention, the above object is achieved in a storage element of the type described above, by providing, between the storage electrode and the semiconductor layer, an insulated electrode, which is disconnected from external potentials, by providing that the semiconductor layer is additionally p-doped and n-doped in a zone beneath a part which is adjacent the selection element of the electrode, and providing that there are arranged on the side of the electrode, opposite the selection element, a potential-controlled electrode and an oppositely doped, surface-side overflow drain zone.

It can advantageously be achieved, with the structure of the present invention, that the surface requirement of the storage element is substantially smaller than that of the known static storage elements which are constructed in the form of bistable flip-flop circuits comprising a plurality of transistors. A significant advantage also resides in the fact that, in contrast with the known dynamic storage elements for the purpose of data storage, no idle power dissipation occurs as a consequence of the periodic re-writing of the stored data.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
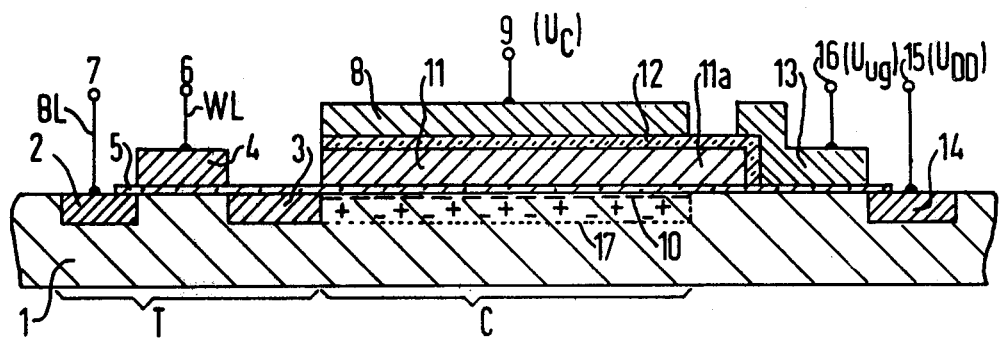
FIG. 1 is a schematic representation, in sectional view, of a first exemplary embodiment of the invention.

FIG. 1 illustrates, in cross-section, a storage element having a selection element which comprises a field effect transistor T. The field effect transistor T comprises, n+-doped source and drain zones 2 and 3 which are arranged at the surface of a p-doped semiconductor layer 1, and enclose therebetween a channel region of the transistor. Above the channel region a gate 4 is formed from an electrically conductive coating which is separated from the semiconductor layer 1 by a thin insulating layer 5. The conductive coating 4 comprises a metal layer, e.g. aluminum, or a highly doped semiconductor layer, particularly polycrystalline silicon.

The gate 4 is connected to a word line WL which is provided with a connection 6. The gate 4 can also represent a section of the word line WL itself, if the word line comprises a strip-shaped portion of an electrically conductive coating. The source zone 2 is connected to a bit line BL, on the other side, which can be constructed in the form of a strip-shaped region arranged at the surface of the substrate 1 and is oppositely doped. The bit line BL is provided with a connection 7.

To the right of the field effect transistor T in FIG. 1, a storage capacitor C is provided which comprises a storage electrode 8 arranged above the semiconductor layer 1 and isolated from the semiconductor layer. The storage electrode 8 is provided with a connection 9 which is connected to a constant voltage UC. The portion of the semiconductor layer which is disposed beneath the storage electrode 8 is also designated as the storage region. In the storage region, a space charge zone, not illustrated in detail, is formed under the influence of the potential UC, as well as an inversion layer 10 at the surface of the semiconductor layer 1, the inversion layer being formed from minority charge carriers and being connected to the drain zone 3. The inversion layer 10 is indicated in FIG. 1 by a broken line.

Between the storage electrode 8 and the surface of the storage region, an electrode 11 is disposed, which electrode is not connected to external potentials, but which is separated by the insulating layer 5 from the semiconductor layer 1. The electrode 11 is additionally insulated by an insulating layer 12 from the storage electrode 8. By way of a portion 11a, the electrode 11 projects on the side of the storage electrode 9 opposite the selection transistor T, the projection extending out from beneath the storage electrode 8. In further succession, on the right, an overflow electrode 13 is connected to the portion 11a, the overflow electrode 13 being disposed in the same plane and insulated from the semiconductor layer 1 by the insulating layer 5. The overflow electrode 13 is insulated from the electrode 11 by the right-side portion of the insulting layer 12. On further to the right is an overflow drain zone 14 which is arranged at the surface of the semiconductor layer 1 and which is oppositely doped, the overflow drain zone 14 being connected by way of a connection 15 to a supply voltage UDD. The overflow connection 13 is provided with a terminal 16 which is connected to a voltage Uug.

The semiconductor layer 1 is provided, within a surface zone, with an additional p-doping and an n-doping, this zone being emphasized in FIG. 1 by the broken line 17 and being indicated by the dope symbols "+" and "—". The additional p-doping is advantageously brought about through an implantation of acceptor ions at a depth of several 1000 Å, while the additional n-doping is brought about through an implantation of donor ions in the intermediate region of the surface of the semiconductor layer 1 or at a very small penetration depth. What is achieved through the additional p-doping is that the surface potential within the storage region 17, in dependence upon the potential connected to the storage electrode 8, and correspondingly also in dependence upon the potential occurring at the electrode 11, changes more slowly in the region of small potential values than would be the case without the additional p-doping. On the other hand, what is achieved through the additional n-doping is that the curve representing the connection between the surface potential of the semiconductor layer 1 within the zone 17 and the potential of the electrode 11 is paralleldisplaced in the direction of smaller values of the electrode potential.

The connections between the surface potential and the electrode potential of a storage region, additionally p-doped and n-doped beneath the electrodes, are described in the publication "IEEE Journal of Solid-State Circuits", Vol. SC-11, No. 1, February 1976, pp. 58–63, particularly in connection with FIG. 4.

Figure 3:
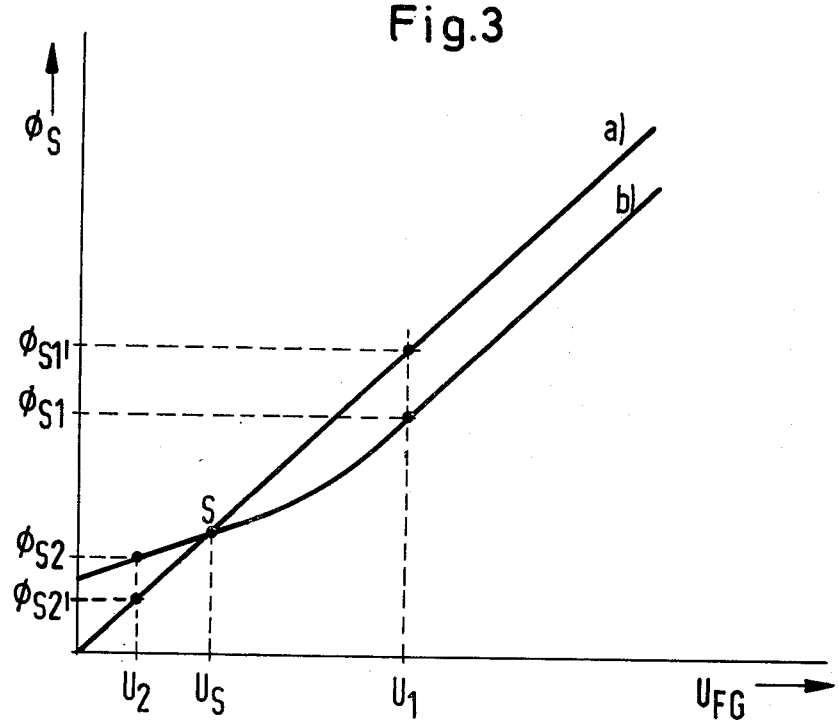
FIG. 3 is a graphic illustration of voltage with respect to time for explaining the actuation of the storage element of FIG. 1.

FIG. 3 illustrates the dependencies of the surface potential $\phi_S$, occurring within the zone 17, upon the electrode voltage $U_{FG}$, applied with respect to ground, at the electrode 11 and 11a, which results in the influence of the voltage $U_C$ connected to the storage electrode 12 (curve b). On the other hand, a curve a in FIG. 3 illustrates the surface potential $\phi_S$ occurring beneath the electrode region 11a in the semiconductor layer not additionally doped, in dependence upon the potential $U_{FG}$. The curve a essentially represents a straight line if the semiconductor layer 1 is provided with a sufficiently high ohmic construction through a correspondingly low doping; therefore, for example, if it manifests a resistance value of 15 ohm-cm. The curve b illustrates the deviations, which are described above, from the course of the curve a which are brought about to the additional dopings. The intersection of the curves a and b is designated by the reference S. For additional voltages $U_{FG}$ which are greater than the voltage $U_S$, allocated to the point S, the surface potential $\phi_S$ for the curve a is greater than that for the curve b, whereas this ratio is reversed for the electrode voltages $U_{FG}$ which are smaller than the voltage $U_S$.

Figure 2:
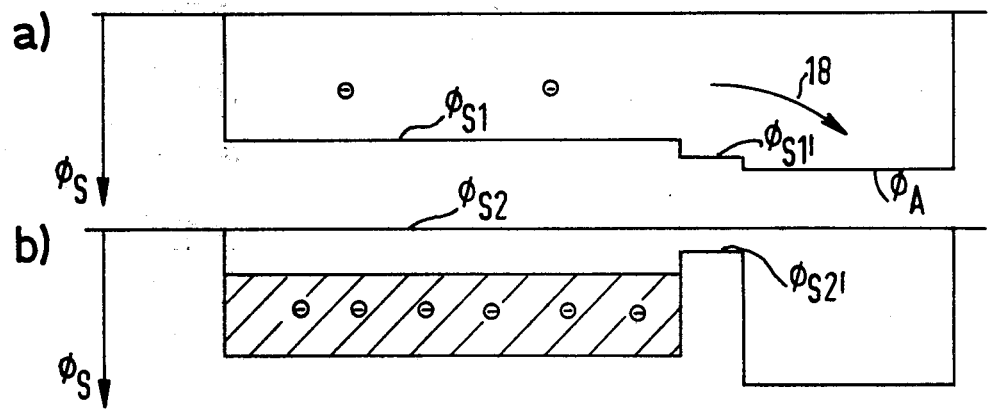
FIG. 2 is a diagram of the surface potential of the semi-conductor layer of FIG. 1.

FIG. 2a illustrates the characteristic of the surface potential $\phi_S$ of the semiconductor layer 1 in the case of storage of a logic "1"; i.e., during the absence of an inversion layer 10. As is apparent from the drawing, the potential $\phi_S$, in the region of the drain zone 3 and the zone 17, corresponds to a relatively large value $\phi_{S1}$, to which is allocated, in accordance with FIG. 3, a value of the electrode voltage $U_{FG}$ of $U_1 \cdot U_1$, on the other hand, causes a surface potential $\phi_{S1}$ to occur beneath the portion 11a of the electrode 11; i.e., in a portion of the semiconductor layer 1 which is not additionally doped. The overflow gate 13, which is connected to the voltage $U_{ug}$, and the overflow drain zone 14, through which, by way of the connection 15, the equally great voltage $U_{DD}$ is connected, result in a potential step $\phi_A$ which represents the maximum surface potential of the entire arrangement. The potential characterisitc according to FIG. 2 leads to a flow of charge carriers generated in the storage region, corresponding to the arrow 18, to the overflow drain zone 14, and to a removal therefrom, such that the charges will not falsify the stored state or be able to effect a transfer into the other non-stored state.

In the case of a stored "0"; i.e. in the case of a present inversion layer 10, the resulting curve of the surface potential $\phi_S$ is represented in FIG. 2b. In the zone 17, the potential $\phi_S$ is changed, through the influence of the inversion layer 10, to the potential value $\phi_{S2}$, such that a voltage $U_{FG}=U_2$ results at the electrode 11 according to FIG. 3. This voltage, which is also connected to the portion 11a of the electrode 11, brings about, beneath the portion 11a, a reduction in the surface potential to the value $\phi_{S2}$, such that a potential barrier is formed by way of which the charge carriers of the inversion layer 10 cannot flow off to the overflow drain zone 14.

Therefore, the electrode 11, 11a, controls, in dependence upon the potential resulting at the surface of the zone 17, a potential barrier in such a manner that it occurs only in the case of a stored "0" ($\phi_{S2'}$), but not in the case of a stored "1" ($\phi_{S1'}$). Hence, in the case of a stored "1", there is a conductive connection from the storage element to the overflow drain zone 14; in the case of a stored "0", however, there is no such conductive connection. The function of a static storage element results wherein the respective storage states are maintained.

During writing and reading of information, the word line WL and, hence, the gate 4 are brought, through the supply of a voltage of e.g. 5 volts, by way of the gate 6, to such a potential that the channel region between the zones 2 and 3 is conductive. If a voltage of 5 volts is then connected to the connection 7 of the bit line BL, a "1" is written as a consequence of the migration away of the charge carriers of a possibly present inversion layer 10 to the bit line BL. Of, on the contrary, the connection 7 is connected to ground potential, no removal of charge carriers from the zone 17 takes place, but, on the contrary, a supply of charge carriers from the zone 2 into the zone 17 occurs, insofar as an inversion layer 10 was not yet present. A "0" is therefore written into the storage element. In order that, during the writing of a "0" into a storage element, in which a "1" was previously stored, no undesired leakage of the charge to be stored takes place, at the moment of writing, and leading to the overflow drain zone 14, the overflow gate 13, during writing, is influenced through disconnection of the voltage $U_{ug}$ and supply of ground potential at the terminal 16 such that a potential barrier results beneath the gate 13; i.e. between the storage capacitor C and the overflow drain zone 14. Reading of the stored information proceeds in a known manner by switching-on of the transistor T, whereby the bit line BL is connected to a reference voltage which lies between the potential values of the storage element in the presence and absence of an inversion layer 10.

In the fabrication of the storage element according to FIG. 1, it is possible to advantageously proceed such that the gate 4 of the storage transistor T and the electrode 11, 11a are formed from parts of one and the same conductive coating, separated from the semiconductor surface by the insulating layer 5, whereas the storage electrode 8 and the overflow electrode 13 consists of parts of a second conductive coating arranged above the first and separated from the first by the insulating layer 12. It is of particular advantage to fabricate a storage element of this kind in the double-silicon-gate technique wherein the aforementioned conductive coatings consist of polycrystalline silicon and represent doping masks for the drain zone 3 and the overflow drain zone 14. Advantageously, the insulating layers 5 and 12 are formed from SiO₂, with reference to the MOS technology.

Figure 4:
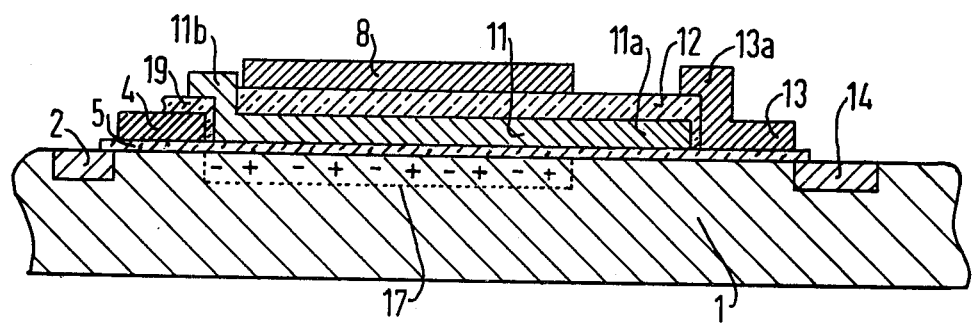
FIG. 4 is a schematic representation, in sectional view, of a second exemplary embodiment of the invention.

FIG. 4 illustrates a storage element which differs from the illustrated in FIG. 1 in that the drain zone 3 has been omitted and, simultaneously, the electrode 11, 11a has been extended to the edge of the gate 4. The electrode 11 thus overlaps the gate 4 of a portion 11b, whereas the overflow electrode 13, as also shown in FIG. 1, overlaps the electrode portion 11a with a portion 13a. Through these minor structural modifications, a selection element results which, in contrast with the transistor T of FIG. 1, can be referred to as a charge-coupled element, and comprises, in addition to the source zone 2, only a gate 4 which, in this case, is designated as a transfer gate. The voltages applied in FIG. 1 are also provided in the exemplary embodiment of FIG. 4, such that the method of operation already described with respect to FIG. 1–3 results for the embodiment of FIG. 4. For the arrangement according to FIG. 4, a fabrication in triple-gate technology is advantageous, wherein the gate 4 is formed from a first conductive coating, the electrode 11, 11a is formed from a second conductive coating, and the electrode 8 and the overflow electrode 13, 13a are formed from a third conductive coating. The insulating layers 12 and 19 are then disposed between these coatings. Fabrication in the MOS technology takes place advantageously, whereby the conductive coatings advantageously consists of polycrystalline silicon and serve as doping masks in relation to the source zone 2 and the overflow drain zone 14.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a storage element of the type which comprises a storage capacitor including a storage electrode arranged over and insulated from a doped semiconductor substrate of one conductivity type and connected to a constant voltage, and comprising a selection element which includes a gate electrode connected to a word line arranged insulated above the substrate and an doped source zone of the opposite conductivity type connected to a bit line and arranged at a surface of the substrate, the selection element operable to selectively connect the source zone to a surface storage region of the substrate located beneath the storage electrode, the improvement therein comprising:
    an insulated electrode carried over the substrate and beneath the storage electrode, said insulated electrode insulated from the substrate and from the storage electrode,
    an additionally p and n doped zone beneath a portion of said insulated electrode adjacent the selection element,
    an overflow electrode arranged over the substrate on the side of said insulated electrode opposite the selection element for receiving a control potential, and
    an oppositely doped overflow drain zone in the substrate at said surface adjacent said overflow electrode.

2. The improved storage element of claim 1, wherein said insulated electrode includes a portion which extends outwardly from beneath the storage electrode toward said overflow drain zone.

3. The improved storage element of claim 1, wherein the gate electrode of said selection element and said insulated electrode are constituted by a first metallic coating,
    a first insulating layer is disposed between the substrate and said first metallic coating,
    the storage electrode and said overflow electrode are constituted by a second metallic coating, and
    a second insulating layer is disposed between said second metallic coating and said first metallic coating.

4. The improved storage element of claim 1, wherein the selection element is constructed as a charge-coupled element, the gate electrode is constituted by a first metallic coating, a first insulating layer is disposed between the substrate and said first metallic coating, said insulated electrode is constituted by a second metallic coating, a second insulating layer is disposed between said first and second metallic coatings, the storage electrode and said overflow electrode are constituted by a third conductive coating, and a third insulating layer is disposed between said second and third metallic coatings.

5. The improved storage element of claim 1, wherein said storage element is constructed in accordance with metal-oxide-semiconductor technology.

6. The improved storage element of claim 1, wherein said p and n dopings consist of implanted ions.

* * * * *